United States Patent [19]
Chang et al.

[11] Patent Number: 6,150,217
[45] Date of Patent: Nov. 21, 2000

[54] METHOD OF FABRICATING A DRAM CAPACITOR

[75] Inventors: Ting-Chang Chang, Hsinchu; Cheng-Jer Yang, Ping-Chen, both of Taiwan

[73] Assignee: United Microelectronics Corp., Hsinchu, Taiwan

[21] Appl. No.: 09/321,487

[22] Filed: May 27, 1999

[30] Foreign Application Priority Data

Apr. 13, 1999 [TW] Taiwan ................................. 88105827

[51] Int. Cl.⁷ ............................................... H01L 21/8242
[52] U.S. Cl. .................... 438/255; 438/253; 438/398; 438/947
[58] Field of Search ................................. 438/255, 253, 438/254, 239, 241, 381, 397, 398, 386, 665, 666, 669, 947, 39

[56] References Cited

U.S. PATENT DOCUMENTS

| | | | |
|---|---|---|---|
| 5,427,974 | 6/1995 | Lur et al. | 437/60 |
| 5,670,405 | 9/1997 | Tseng | 437/52 |
| 5,670,406 | 9/1997 | Tseng | 437/52 |
| 5,759,891 | 6/1998 | Tseng | 438/253 |
| 5,770,500 | 6/1998 | Batra et al. | 438/255 |
| 5,821,142 | 10/1998 | Sung et al. | 438/255 |
| 5,943,571 | 8/1999 | Schaefer et al. | 438/257 |
| 6,033,928 | 3/2000 | Eriguchi et al. | 438/42 |
| 6,071,774 | 6/2000 | Sung et al. | 438/255 |
| 6,074,913 | 6/2000 | Lou et al. | 438/255 |

*Primary Examiner*—Mary Wilczewski
*Assistant Examiner*—David Goodwin
*Attorney, Agent, or Firm*—Hickman Coleman & Hughes, LLP

[57] ABSTRACT

A method of fabricating a DRAM capacitor. A silicon germanium layer is formed on a lower electrode of the capacitor. The silicon germanium layer is oxidized to form a segregated grained germanium layer and a silicon oxide layer where the segregated grained germanium is distributed on the lower electrode. The silicon oxide layer is then removed. Using the segregated grained germanium as a hard mask, the lower electrode is etched to a depth to form a multi-cylinder structure. The segregated grained germanium is then removed. A capacitor dielectric layer and an upper electrode are successively formed on the multi-cylinder structure.

20 Claims, 6 Drawing Sheets

METHOD OF FABRICATING A DRAM CAPACITOR

BACKGROUND OF THE INVENTION

1. Field of the Invention

The invention relates to a method of fabricating a dynamic random access memory (DRAM), and more particularly to a method of fabricating a DRAM capacitor.

2. Description of the Related Art

A dynamic random access memory cell, normally called a memory cell, includes a transistor and a capacitor. The capacitor is used to store a bit of data in a memory device. Data storage for DRAM selectively charges or discharges each capacitor in the capacitor array on a semiconductor substrate. For a capacitor with a fixed operative voltage, the capacitance of the capacitor is decided by the surface area of the capacitor electrode when the thickness and the dielectric constant of the capacitor dielectric layer are both fixed.

The size of DRAM cell is gradually reduced as the integration of integrated circuits is continuously increased. It is well known by people skilled in the art that the capacitance of the capacitor is decreased since its size is reduced. The decreased capacitance easily causes soft errors by α rays, which results in a data storage failure in the memory cells.

Therefore, a capacitor structure with high integration and capacitance is required, thereby keeping a desired capacitance under the circumstances in which the size of the capacitor is reduced to make possible a DRAM with high capacitance and good performance.

FIGS. 1A–1C shows cross-sectional views illustrating fabrication of a stacked DRAM capacitor according to prior art. Referring to FIG. 1, a field oxide layer 12 used to isolate the active areas is formed on a semiconductor substrate 10. A transistor composed of a gate oxide layer 14, a gate electrode 16 and a source/drain region 18, 20 is formed on the substrate 10. An insulating layer 22 is then formed over the substrate 110 and patterned to form a contact window 23 within the insulating layer 22 to expose the source/drain region 18.

Referring to FIG. 1B, a conductive layer 24 is formed and fills the contact window 23 to electrically connect to the source/drain region 18. The conductive layer 24 is used to serve as a lower electrode of DRAM capacitor. Thereafter, a capacitor dielectric layer 26 and a conductive layer 28 are successively formed on the conductive layer 24, as shown in FIG. 1C, to achieve a stacked capacitor.

As shown in FIG. 1C, a portion of the lower electrode 24 expands onto the insulating layer 22 to increase its surface area. However, since the density of the device is increased, the range of the lower electrode 24 cannot expand as widely as possible. Accordingly, the capacitance of the capacitor is decreased.

SUMMARY OF THE INVENTION

This invention therefore provides an improved method of fabricating a DRAM capacitor with a multi-cylinder lower electrode, thereby increasing the capacitance of the capacitor.

To achieve these objects and advantages, and in accordance with the purpose of the invention, as embodied and broadly described herein, the invention is directed towards a method of fabricating a DRAM capacitor. A transistor including a gate oxide layer, a gate electrode and a source/drain region is formed on a substrate. An insulating layer having a contact window therein is then formed on the substrate to expose the source/drain region. A first conductive layer is formed on the insulating layer and fills the contact window. A silicon germanium layer is formed on the first conductive layer and then oxidized to form a segregated grained germanium layer and a silicon oxide layer. After removing the silicon oxide layer, using the segregated germanium as a mask, the first conductive layer is etched to a depth to form a multi-cylinder structure that serves as a lower electrode. The segregated grained germanium is then removed. A capacitor dielectric layer and a second conductive layer serving as an upper electrode are successively formed on the multi-cylinder structure.

It is to be understood that both the foregoing general description and the following detailed description are exemplary and explanatory only and are not restrictive of the invention, as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
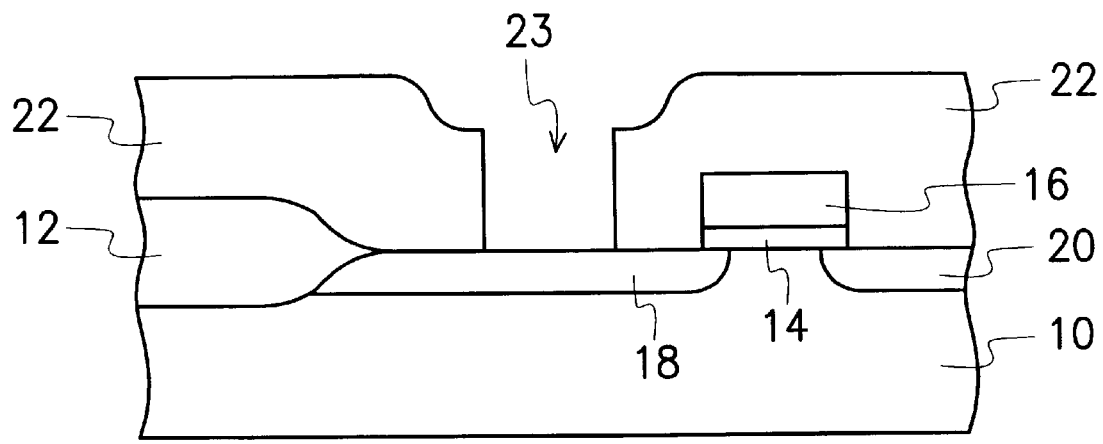
FIGS. 1A–1C are schematic, cross-sectional views illustrating fabrication of a stacked capacitor in prior art.
Figure 1B:
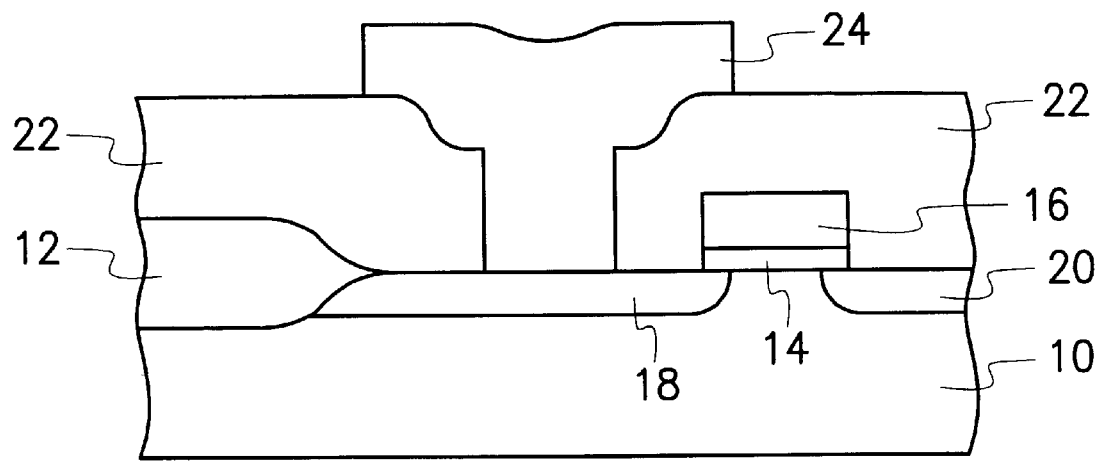
Figure 1C:
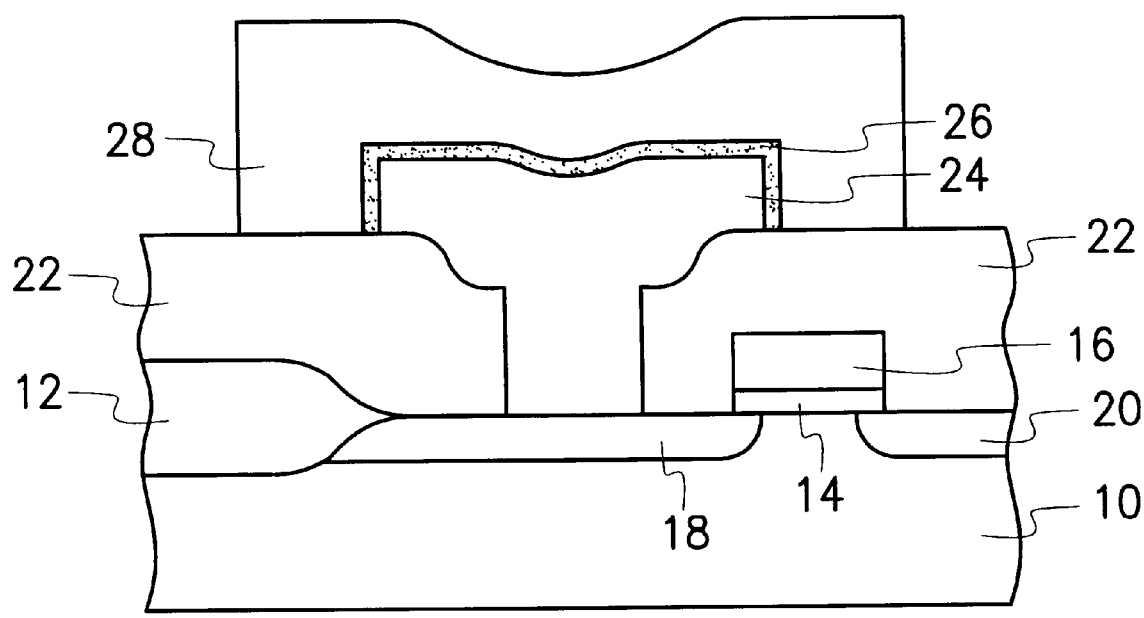

Reference will now be made in detail to the present preferred embodiments of the invention, examples of which are illustrated in the accompanying drawings. Wherever possible, the same reference numbers are used in the drawings and the description to refer to the same or like parts.

Capacitance C of a capacitor has the following relation with the capacitor dielectric constant $\epsilon$, the surface area A of the electrode, and the distance D between the lower electrode and the upper electrode:

$$C = \epsilon * A / D$$

According to the equation above, when the distance D between the electrodes and the dielectric constant $\epsilon$ is constant, the surface area A of the electrode is capable of deciding the capacitance of the capacitor. The intention of this invention is to fabricate a multi-cylinder lower electrode that increases the efficient surface itself, thereby increasing the capacitance of the capacitor. FIGS. 2A–2H show fabrication of the multi-cylinder lower electrode for a DRAM capacitor according to the invention.

Figure 2A:
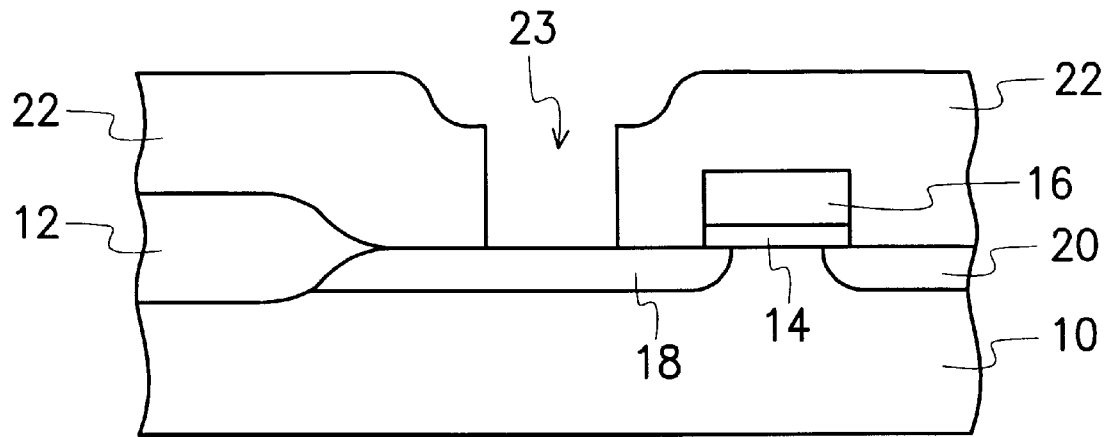
FIGS. 2A–2H are schematic, cross-sectional views illustrating fabrication of a stacked capacitor in a preferred embodiment according to the invention.

Referring to FIG. 2A, a transistor including a gate oxide layer 14, a gate electrode 16 and a doped region 18, 20 such as source/drain region is formed on a substrate, such as silicon substrate. An isolation structure 12 such as field oxide or shallow trench isolation (STI) used to isolate the active areas is formed on the substrate 10.

An insulating layer 22, which can be a silicon oxide deposited by chemical vapor deposition (CVD) or a silicon-on-glass (SOG) spun by coating, is formed over the substrate 10 to cover the transistor and the isolation structure 12. Photolithography and etching processes are utilized to form a contact window 23 within the insulating layer 22, as shown in FIG. 2A, by which contact window 23 the source/drain region 18 is exposed.

Figure 2B:
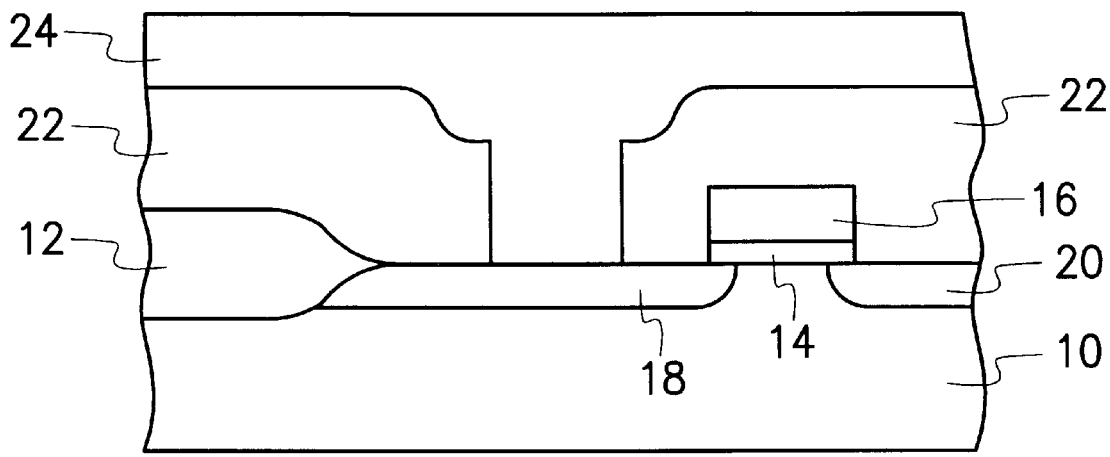

Referring to FIG. 2B, the contact window 23 is filled with a conductive layer 24, which extends onto the insulating layer 22 and electrically connects to the source/drain region 18. The conductive layer 24 can be a polysilicon layer with dopants and serves as a lower electrode of the DRAM capacitor.

Figure 2C:
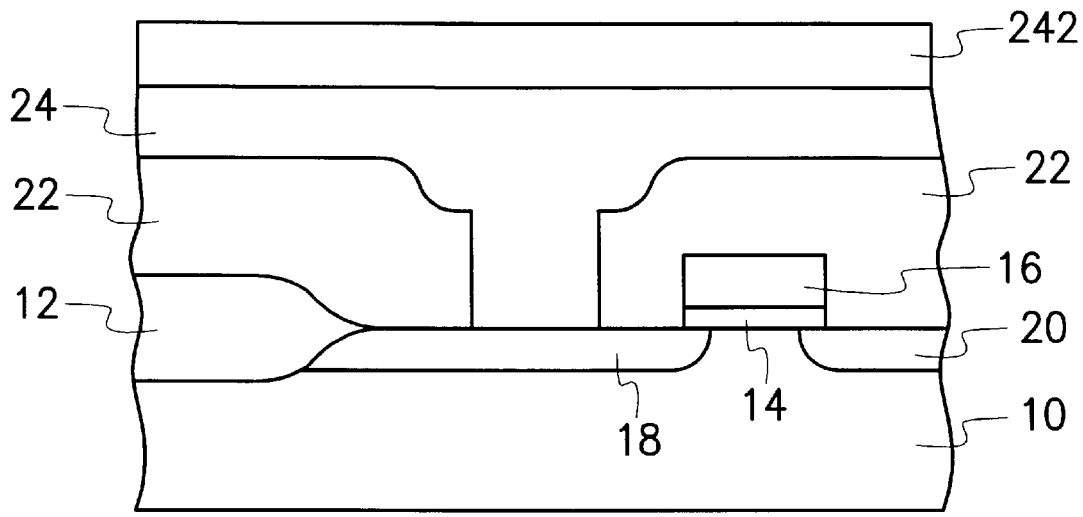

Referring to FIG. 2C, a silicon germanium ($Si_{1-x}Ge_x$) layer 242 is formed on the conductive layer 24 by a method such as CVD or ultra-high vacuum chemical vapor deposition (UHVCVD). The thickness of the silicon germanium layer 242 is in the range of about 100–1000 angstroms and the stoichiometry of x is in the range of about 0.1–0.5.

Figure 2D:
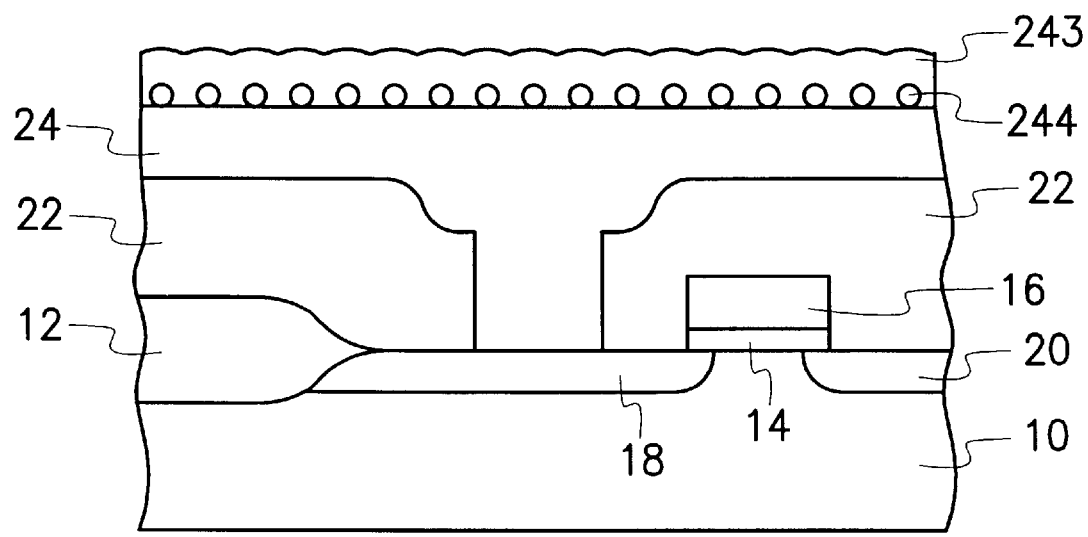

As shown in FIG. 2D, an oxidation step such as wet oxidation or dry oxidation is performed on the silicon germanium layer 242 in an ambient temperature of about 700–900° C. Since the germanium is segregated from the silicon germanium layer 242 during the oxidation step, accordingly, a segregated grained germanium layer 244 is formed and randomly distributed on the conductive layer 24. After segregation of grained germanium layer 244, the silicon germanium layer 242 (FIG. 2C) transforms into a silicon oxide layer 243 as illustrated in FIG. 2D.

Figure 2E:
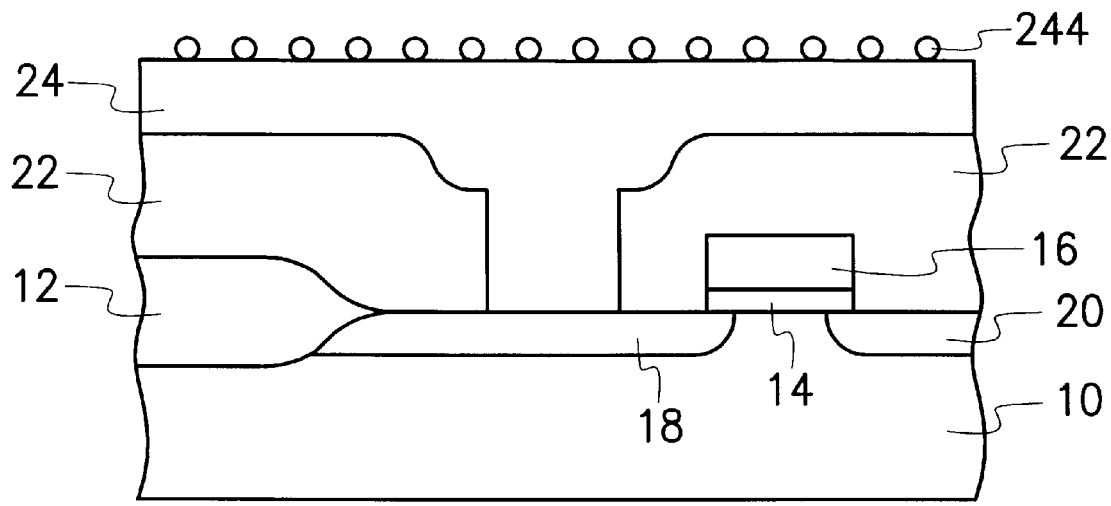

Referring to FIG. 2E, the silicon oxide layer 243 on the conductive layer 24 is then removed by wet etching using an etchant such as HF solution or BOE. As a result, the segregated grained germanium 244 remains on the conductive layer 24.

Figure 2F:
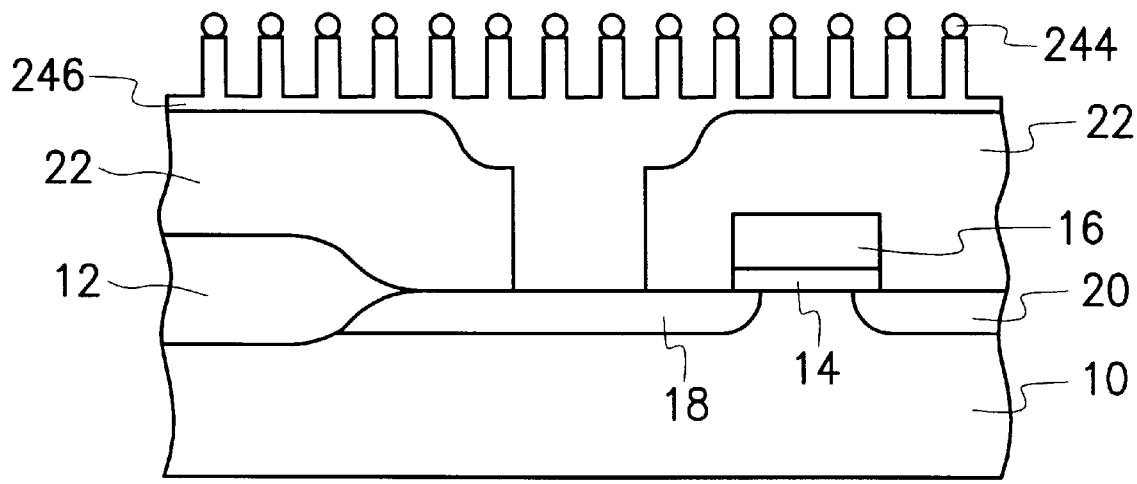

Referring to FIG. 2F, using the segregation of the segregated grained germanium 244 as a hard mask, an etching step is performed on the conductive layer 24 underlying the segregated grained germanium 244. A conductive layer 246 with a multi-cylinder structure is therefore formed to serve as a lower electrode of DRAM capacitor. The etching step is performed by reactive ion etching (RIE), for example, to etch the exposed conductive layer 242 to a depth, which depends on the thickness of the conductive layer 24, but not to etch through the conductive layer 24. In addition, the etching step can be performed by wet etching.

Figure 2G:
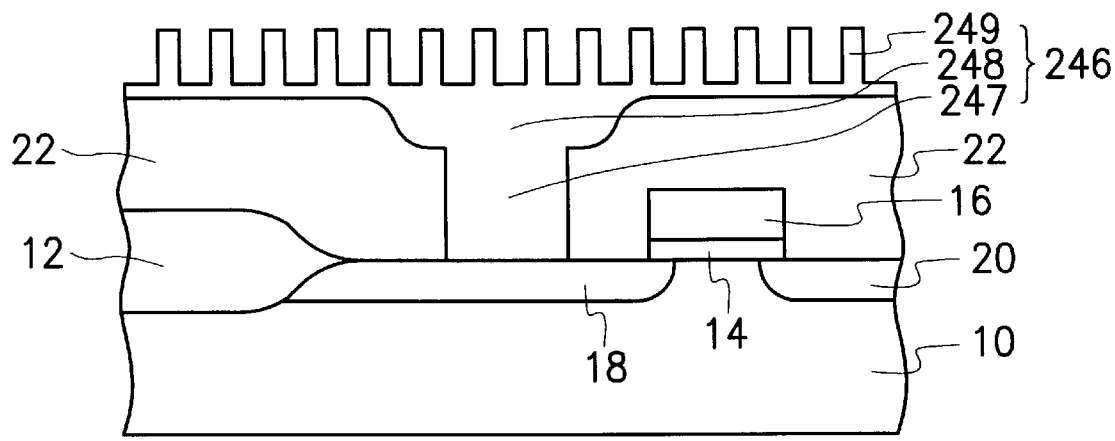

Referring to FIG. 2G, the segregated grained germanium 244 on the conductive layer 246 can be removed by wet etching, for example.

Figure 2H:
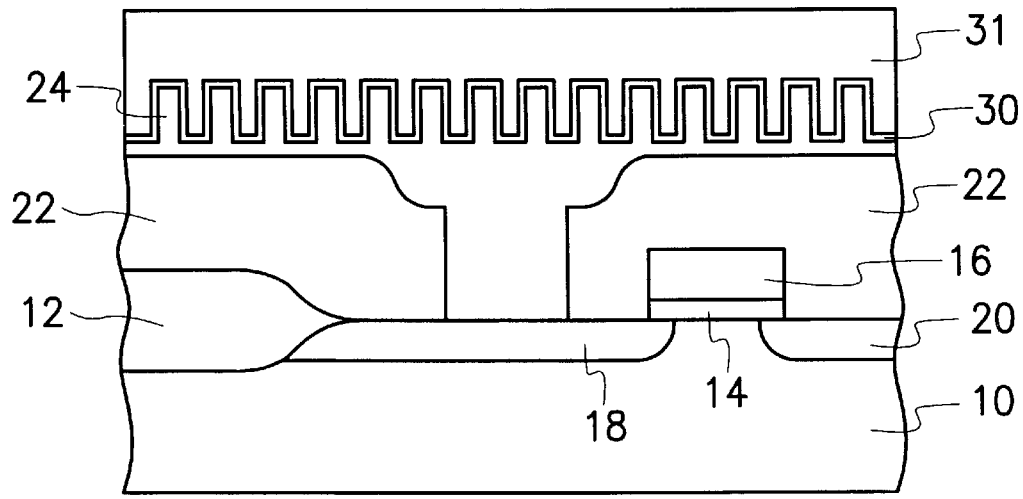

Referring to FIG. 2H, a capacitor dielectric layer 30 and a conductive layer 31 are successively formed on the conductive layer 246. The conductive layer 31 can be a polysilicon layer and formed by CVD, for example, to serve as an upper electrode.

The fabricating method of this invention is not restricted in the use to a DRAM capacitor. The capacitor fabricated according to the present invention can be used wherever capacitors are required.

According to the embodiment of the invention, the surface area of the stacked capacitor lower electrode is increased, thereby effectively enhancing the capacitance of the capacitor and improving the performance of the capacitor.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a DRAM capacitor, comprising:
   providing a substrate having a doped region;
   forming an insulating layer over the substrate where the insulating layer has a contact window to expose the doped region;
   forming a first conductive layer to fill the contact window;
   forming a silicon germanium layer on the first conductive layer;
   forming a segregated grained germanium in the silicon germanium layer on the first conductive layer and the silicon germanium layer being transformed into a silicon oxide layer on the first conductive layer;
   removing the silicon oxide layer;
   forming a multi-cylinder lower electrode by removing the first conductive layer to a depth using the segregated grained germanium as a mask;
   removing the segregated grained germanium;
   forming a capacitor dielectric layer on the multi-cylinder lower electrode; and
   forming a second conductive layer on the capacitor dielectric layer to serve as an upper electrode.

2. The method according to claim 1, wherein the silicon germanium layer is formed by ultra high vacuum CVD.

3. The method according to claim 1, wherein a thickness of the silicon germanium layer is in a range of about 100–1000 angstroms.

4. The method according to claim 1, wherein stoichiometry of germanium in the silicon germanium layer is in a range of about 0.1–0.5.

5. The method according to claim 1, wherein the step of forming the segregated grained germanium includes oxidizing the silicon germanium layer.

6. The method according to claim 5, wherein the ambient temperature of oxidation is in a range of about 700–900° C.

7. The method according to claim 1, wherein the step of forming a multi-cylinder lower electrode by removing the first conductive layer to a depth is performed by reactive ion etching (RIE).

8. The method according to claim 2, wherein the step of forming a multi-cylinder lower electrode by removing the first conductive layer to a depth includes wet etching.

9. The method according to claim 1, wherein the step of removing the segregated grained germanium layer includes wet etching.

10. The method according to claim 1, wherein the first conductive layer is removed to a depth, but is not etched through.

11. A method of fabricating a lower electrode of a DRAM capacitor adapted for a substrate where the substrate has an insulating layer formed thereon, a first conductive being disposed on the insulating layer and electrically connecting to the substrate through a contact within the insulating layer, comprising:
   forming a silicon germanium layer on the first conductive layer;
   oxidizing the silicon germanium layer to form a segregated grained germanium on the first insulating layer and a silicon oxide layer;
   removing the silicon oxide layer;
   etching the first conductive layer to a depth by using the segregated grained germanium layer as a mask to form a multi-cylinder lower electrode;
   removing the segregated grained germanium layer.

12. The method according to claim 11, wherein the silicon germanium is formed by ultra high vacuum CVD.

13. The method according to claim 11, wherein a thickness of the silicon germanium is in a range of about 100–1000 angstroms.

14. The method according to claim 11, wherein stoichiometry of germanium in the silicon germanium layer is in a range of about 0.1–0.5.

15. The method according to claim 11, wherein the step of oxidizing the silicon germanium layer includes wet oxidation.

16. The method according to claim 11, wherein the step of oxidizing the silicon germanium layer includes dry oxidation.

17. The method according to claim 11, wherein the ambient temperature for oxidizing the silicon germanium layer is in a range of about 700–900° C.

18. The method according to claim 11, wherein the step of etching the first conductive layer to a depth includes reactive ion etching (RIE).

19. The method according to claim 11, wherein the first conductive layer is etched to a depth, but is not etched through.

20. The method according to claim 11, wherein the step of removing the silicon oxide layer includes wet etching.

* * * * *